United States Patent
Gruner et al.

(10) Patent No.: US 11,146,224 B2
(45) Date of Patent: Oct. 12, 2021

(54) BROADBAND POWER COMBINING ARRANGEMENT

(71) Applicant: COMET AG, Flamatt (CH)

(72) Inventors: Daniel Gruner, Muellheim (DE);
Anton Labanc, Ehrenkirchen (DE);
Cyril Guinnard, Chavornay (CH)

(73) Assignee: Comet AG, Flamatt (CH)

( * ) Notice: Subject to any disclaimer, the term of this patent is extended or adjusted under 35 U.S.C. 154(b) by 25 days.

(21) Appl. No.: 16/686,309

(22) Filed: Nov. 18, 2019

(65) Prior Publication Data
US 2020/0169230 A1 May 28, 2020

(30) Foreign Application Priority Data
Nov. 23, 2018 (GB) ..................................... 1819140

(51) Int. Cl.
*H03F 3/21* (2006.01)
*H01J 37/32* (2006.01)
(Continued)

(52) U.S. Cl.
CPC ........ *H03F 3/211* (2013.01); *H01J 37/32183* (2013.01); *H03F 1/565* (2013.01);
(Continued)

(58) Field of Classification Search
CPC ...... H03F 3/211; H03F 1/565; H03F 2200/09;
H03F 2200/171; H03F 2200/387; H03F
2200/451; H03F 2203/21139; H03F
2203/21142; H01J 37/32183; H01J
2237/24564; H03H 7/383; H03H 7/48;
H05K 1/025
(Continued)

(56) References Cited

U.S. PATENT DOCUMENTS 5,339,057 A   8/1994 Rauscher
6,252,461 B1  6/2001 Raab
(Continued)

FOREIGN PATENT DOCUMENTS

EP       3109898 A1     12/2016
KR   1020050019628 A    3/2005

OTHER PUBLICATIONS

Okada et al., "Compact Lumped-Element 5-Way Wilkinson Power Divider with Broadband Operation", Proceedings of the 46th European Microwave Conference, Oct. 4-6, 2016, London, UK, pp. 202-205. (Year: 2016).*

(Continued)

*Primary Examiner* — Hafizur Rahman
(74) *Attorney, Agent, or Firm* — The Webb Law Firm

(57) ABSTRACT

A generator including a power combiner is provided. The power combiner includes a plurality of inputs, each input connectable to a respective power amplifier for receiving a respective power signal. A plurality of impedance matching circuit branches is connected to a respective one of the plurality of inputs. Each impedance matching circuit branch includes at least one high pass filter section and at least one low pass filter section through which the respective power signal passes. The impedance matching circuit branches are connected so as to combine the power signals from each power amplifier. An output is provided for outputting the combined power signal.

18 Claims, 7 Drawing Sheets

(51) Int. Cl.
 *H03F 1/56* (2006.01)
 *H03H 7/38* (2006.01)
 *H03H 7/48* (2006.01)
 *H05K 1/02* (2006.01)

(52) U.S. Cl.
 CPC .............. *H03H 7/383* (2013.01); *H03H 7/48* (2013.01); *H05K 1/025* (2013.01); *H01J 2237/24564* (2013.01); *H03F 2200/09* (2013.01); *H03F 2200/171* (2013.01); *H03F 2200/387* (2013.01); *H03F 2200/451* (2013.01); *H03F 2203/21139* (2013.01); *H03F 2203/21142* (2013.01)

(58) Field of Classification Search
 USPC ........................................................ 333/129
 See application file for complete search history.

(56) References Cited

U.S. PATENT DOCUMENTS

2016/0150632 A1* 5/2016 Viswanathan ........ H03F 1/0288
 361/761
2017/0163237 A1 6/2017 Lee et al.

OTHER PUBLICATIONS

Li et al., "A high performance compact Wilkinson power divider using GaAs-based optimized integrated passive device fabrication process for LTE application", Solid-State Electronics, Sep. 2014, pp. 147-153. (Year: 2014).*

* cited by examiner

BROADBAND POWER COMBINING ARRANGEMENT

CROSS-REFERENCE TO RELATED APPLICATION

This application claims priority to United Kingdom Patent Application No. 1819140.3 filed Nov. 23, 2018, the disclosure of which is hereby incorporated by reference in its entirety.

BACKGROUND OF THE INVENTION

Field of the Invention

The present disclosure generally relates to a power combiner and a generator. The present disclosure particularly relates to an impedance matching circuit for use in combing power signals from respective power amplifiers.

Description of Related Art

A block diagram of an exemplary, known, radiofrequency, RF, generator 10 is illustrated in FIG. 1. The RF generator 10 includes an alternating current, AC, input 12 and an AC to direct current, DC, converter 14 that is connected to supply DC power to a plurality (n) of RF power amplifiers 16a to 16n of a power amplification module 18. A controller 22 is connected to supply radio frequency signals to the power amplifiers 16a to 16n. The radiofrequency power supplied by each power amplifier 16a to 16n is input to an n to 1 power combiner 20 that performs power combining functions and is configured to output a combined power signal. In some RF generators, a sensing circuit 24 is connected to sense one or more characteristics of the combined output power from the power combiner 20 for use by the controller 22 in implementing a control loop for controlling combined output power. The combined output power is usable by a radiofrequency tool.

Some such RF generators 10 are designed to provide a targeted combined RF output power at a nominal center RF frequency, $f_C$, e.g. 1 kW at $f_c$=13.56 MHz. In some applications, such as plasma applications, a relative bandwidth of 10% (fc±5%) is required in order to enable matching procedures by adaptively changing the RF operating frequency (frequency tuning). Adaptively changing RF operating frequency is useful for customizing and optimizing processes. Furthermore, a large relative bandwidth is useful in multifrequency systems using more than one RF generator 10 in which an interaction between the generators 10 due to harmonic disturbance is desirably avoided.

Accordingly, an increased bandwidth for an RF generator 10 is desirable in some applications and can offer considerable advantages.

Some generators 10 use a power combiner 20 to combine power signals from n power amplifiers 16a to 16n by connecting the power amplifiers 16a to 16n in parallel. In order to maintain a desired characteristic system impedance $Z_0$ (e.g. 50 Ohm), an impedance matching circuit can be provided at the output of the power amplification module 18 that transforms $Z_0$ to $n*Z_0$. Branches extending from each power amplifier 16a to 16n are connected after the impedance matching circuit. A further methodology is the direct parallel connection of the power amplifiers at their outputs followed by a single impedance matching network transforming $Z_0/n$ to $Z_0$.

Known impedance matching circuits for combining plural inputs from respective power amplifiers have limitations. It has generally been found that the greater the numbers of power amplifiers 16a to 16n that are combined by the power combiner 20 including an impedance matching circuit tends towards reduced bandwidth or larger quality, Q, factor of the matching circuit.

Accordingly, it is desirable to provide an impedance matching circuit, power amplifier and generator that allow for relatively broad bandwidth power output. In addition, it is desirable to keep low the number of circuit components used in order to reduce cost and losses. Furthermore, other desirable features and characteristics of the present invention will become apparent from the subsequent detailed description of the invention and the appended claims, taken in conjunction with the accompanying drawings and the background of the invention.

SUMMARY OF THE INVENTION

A power combiner is provided in one aspect. The power combiner includes a plurality of inputs, each input connectable to a respective power amplifier for receiving a respective power signal. A plurality of impedance matching circuit branches is connected to a respective one of the plurality of inputs. Each impedance matching circuit branch includes at least one high pass filter section and at least one low pass filter section through which the respective power signal passes. The impedance matching branches are connected so as to combine the power signals from each power amplifier. An output is included for outputting the combined power signal.

In embodiments, the at least one high pass filter section and the at least one low pass filter section each include a passive filter.

In embodiments, the at least one high pass filter section includes at least one inductor and at least one capacitor. In embodiments, the at least one inductor of the at least one high pass filter section is shunted to ground. In embodiments, the at least one inductor of the high pass filter section is provided by a lumped inductor or by a shorted stub transmission line. In embodiments, the at least one capacitor is provided by a lumped capacitor.

In embodiments, the at least one low pass filter section includes at least one inductor and at least one capacitor. In embodiments, the at least one capacitor of the at least one low pass filter section is shunted to ground. In embodiments the at least one capacitor of the at least one lower pass filter section is provided by a lumped capacitor or by a transmission line. In embodiments, the at least one inductor of the at least one low pass filter section is provided by a lumped inductor or by an open stub transmission line.

In embodiments, the power combiner includes a balancing circuit connecting each of the impedance matching circuit branches. In embodiments, the balancing circuit provides isolation between the plurality of inputs of the power combiner. In embodiments, the balancing circuit includes a plurality of balancing circuit branches respectively connected to each of the impedance matching circuit branches at tapping points. In embodiments, the tapping points are each located between the at least one high pass filter section and the at least one low pass filter section of the respective impedance matching circuit branch. In embodiments, each balancing circuit branch includes at least one resistor and at least one capacitor. In embodiments, each balancing circuit branch includes a resistor and a first capacitor connected in series and a second capacitor connected in parallel to the resistor and the first capacitor. In embodiments, each of the balancing circuit branches are interconnected at a common balancing point.

In embodiments, the at least one high pass filter section and the at least one low pass filter section each include at least one planar inductor and at least one capacitor.

In embodiments, the power combine includes a heat dissipative substrate and at least one printed circuit board disposed thereon. Each of the plurality of impedance matching circuit branches are included on the at least one printed circuit board. Each impedance matching circuit branch is provided by the at least one printed circuit board including an input terminal, a first planar inductor, a first capacitor, a second planar inductor and a second capacitor and an output terminal. The input terminal corresponds to one of the plurality of inputs, the output terminal corresponds to the output, the first capacitor and the first inductor are included in the at least one high pass filter section and the second capacitor and the second planar inductor are included in the at least one low pass filter, thereby forming one of the plurality of impedance matching circuit branches. Each of the plurality of impedance matching circuit branches are correspondingly formed, with the output terminals connected together to provide the combined power signal.

In embodiments, the at least one printed circuit board includes a balancing circuit branch for each of the impedance matching circuit branches connected between the high and low pass filters and including a capacitor and a resistor. The balancing circuit branches are connected together to form a balancing circuit providing isolation between the plurality of inputs of the power combiner.

In embodiments, the power combiner is adapted for frequencies of the combined power signal in the range of 1 to 100 MHz. In embodiments, the power combiner is adapted for an output power level of at least 100 W for the combined power signal.

In embodiments, the power combiner includes n inputs for n power amplifiers and n impedance matching circuit branches. In embodiments, each input of the impedance matching circuit branch has a characteristic impedance $Z_0$ and the output has a characteristic impedance of $n*Z_0$.

In embodiments, each impedance matching circuit branch includes a plurality of high pass filter sections and a plurality of low pass filter sections arranged alternately.

In embodiments, the characteristic impedance $Z_0$ is 50 Ohm.

The aforementioned embodiments are combinable severally and independently in any way.

In another aspect, a generator is provided. The generator includes a plurality of power amplifiers, and a power combiner. The power combiner includes a plurality of inputs, each input connectable to a respective power amplifier of the plurality of power amplifiers for receiving a respective power signal therefrom. A plurality of impedance matching circuit branches is connected to a respective one of the plurality of inputs. Each impedance matching circuit branch includes at least one high pass filter section and at least one low pass filter section through which the respective power signal passes. The impedance matching circuit branches are connected so as to combine the power signals from each power amplifier. The power combiner includes an output for outputting the combined power signal.

The features of the power combiner described in the foregoing aspects and embodiments are applicable to the generator aspect.

In embodiments, the at least one high pass filter section includes at least one inductor and at least one capacitor and the at least one low pass filter section includes at least one inductor and at least one capacitor.

In embodiments, the power combiner includes a balancing circuit connecting each of the impedance matching circuit branches. In embodiments, the balancing circuit provides isolation between the plurality of inputs. In embodiments, the balancing circuit includes a plurality of balancing circuit branches respectively connected to each of the impedance matching circuit branches at tapping points. In embodiments, the tapping points are each located between the at least one high pass filter section and the at least one low pass filter section of the respective impedance matching circuit branch. In embodiments, each balancing circuit branch includes a resistor and a capacitor.

In embodiments, the generator is for supplying radio frequency power to a load as the combined power signal.

In embodiments, the generator includes a direct current, DC, supply configured to convert an input alternating current, AC, power signal to an output DC power signal for supply to each of the power amplifiers in parallel.

In embodiments, the generator includes a controller configured to output signals to each of the power amplifiers for controlling a waveform of the respective power signals from the power amplifiers.

In embodiments, a sensing circuit is configured to sense at least one characteristic of the combined power signal. The sensing circuit is configured to provide at least one sensed signal to the controller. The controller is configured to determine the control signals based on the at least one sensed signal.

In another aspect, a system is provided including a tool connected to the generator. The tool is connected to receive the combined output power. In embodiments, the tool is a plasma tool.

In embodiments, the system is a plasma processing system, wherein the tool includes a plasma chamber. In another aspect, a printed circuit board is provided. In embodiments, the printed circuit board comprises a dielectric substrate, a plurality of input terminals arranged on the dielectric substrate, a plurality of impedance matching circuit branches arranged on the dielectric substrate, wherein each of the impedance matching circuit branches comprises at least one high pass filter section and at least one low pass filter section, each configured to filter an input power signal received by one of the input terminals, and an output terminal arranged on the dielectric substrate, wherein the output terminal is configured to output the combined filtered power signal.

In embodiments, the printed circuit board comprises a balancing circuit connecting each of the impedance matching circuit branches and isolating the input terminals from each other.

BRIEF DESCRIPTION OF THE DRAWINGS

The present invention will hereinafter be described in conjunction with the following drawing figures, wherein like numerals denote like elements.

DESCRIPTION OF THE INVENTION

The following detailed description is merely exemplary in nature and is not intended to limit the invention or the application and uses of the invention. Furthermore, there is no intention to be bound by any theory presented in the preceding background or the following detailed description.

Figure 1:
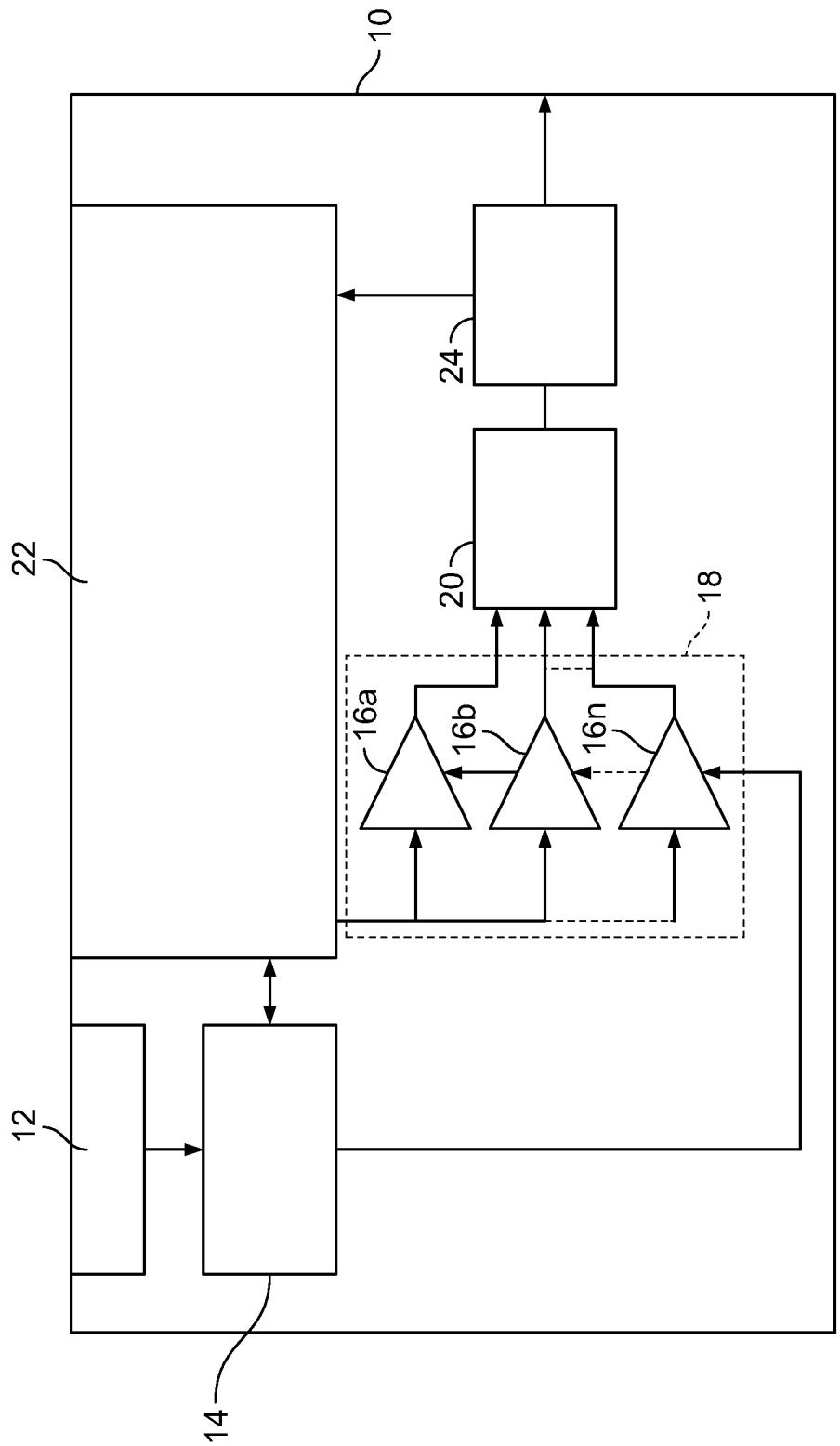
FIG. 1 is a block diagram of a prior art generator including a power combiner, in accordance with various embodiments.

FIG. 1 is a block diagram of a generator 10, particularly a RF generator 10, in accordance with various embodiments. As has heretofore been described, the generator 10 includes an AC input 12, an AC to DC converter 14 for supplying DC power and a power amplification module 18. A controller 22 is configured to provide control signals to the power amplification module 18 and/or to the AC to DC converter 14 to provide the desired RF power signal. The power amplification module 18 is configured to receive the supplied DC power from the AC to DC converter 14 and the control signals from the controller 22 and generate plural parallel output power signals. In embodiments, the power amplification module 18 is configured to split the DC power from the AC to DC converter 14 into respective DC power signals for each of a plurality of power amplifiers 16a to 16n of the power amplification module 18.

In accordance with various embodiments, the generator 10 includes a power combiner 20 that is configured to combine the parallel power signals output from the power amplifiers 16a to 16n. In various embodiments, n corresponds to the power amplification module 18 including at least 2, 3, 4, 5, etc. power amplifiers 16a to 16n. In embodiments, each power amplifier 16a to 16n includes at least one transistor. Various topologies for the power amplifiers 16a to 16n are available for use in embodiments. Exemplary amplifier types include classical prior-art power amplifier classes—class-A, class-AB, class-D, switched-mode power amplifier classes—class-D, class-E, and harmonically tuned classes: class-F and class-F-inverse.

In some embodiments, the generator includes a sensing circuit 24 configured to sense at least one electrical characteristic (e.g. voltage and current) of combined power output from the power combiner 20. The sensing circuit is configured to output sense signals to the controller. The controller 22 is configured to generate control signals based on the sensed signals. The controller 22 is configured to execute closed or open loop control schemes for generating the control signals that are used by the power amplifiers 16a to 16n and/or the AC to DC converter 14 to provide desired output power signals. The controller 22 includes a processor and programming instructions stored on memory, in some embodiments, for instructing generation of the control signals. Those skilled in the art will appreciate that the processor of the controller 22 may be substituted for by using any logic processor (e.g., control circuit) adapted to perform the calculations and/or set of instructions described herein including, but not limited to, field programmable gate array, digital signal processor, and combinations thereof.

In embodiments, the generator 10 outputs a combined power signal having operating frequencies in the radiofrequency range, particularly in the range of of 1-100 MHz, and an output power of at least 100 W.

In various embodiments, the generator 10 has an output connector, such as a coaxial connector, that is configured to connect to a tool. In some embodiments, the tool is a plasma tool. The generator 10 is useful for providing output power signals in a variety of applications including fabrication of semiconductors (e.g. deposition, etching and modification of thin films), medical devices (e.g. electrosurgical devices and medical imaging machines such as magnetic resonance imaging, MRI, machines), food packaging, commercial surface modifications and coatings, broadcasting, etc.

Figure 2:
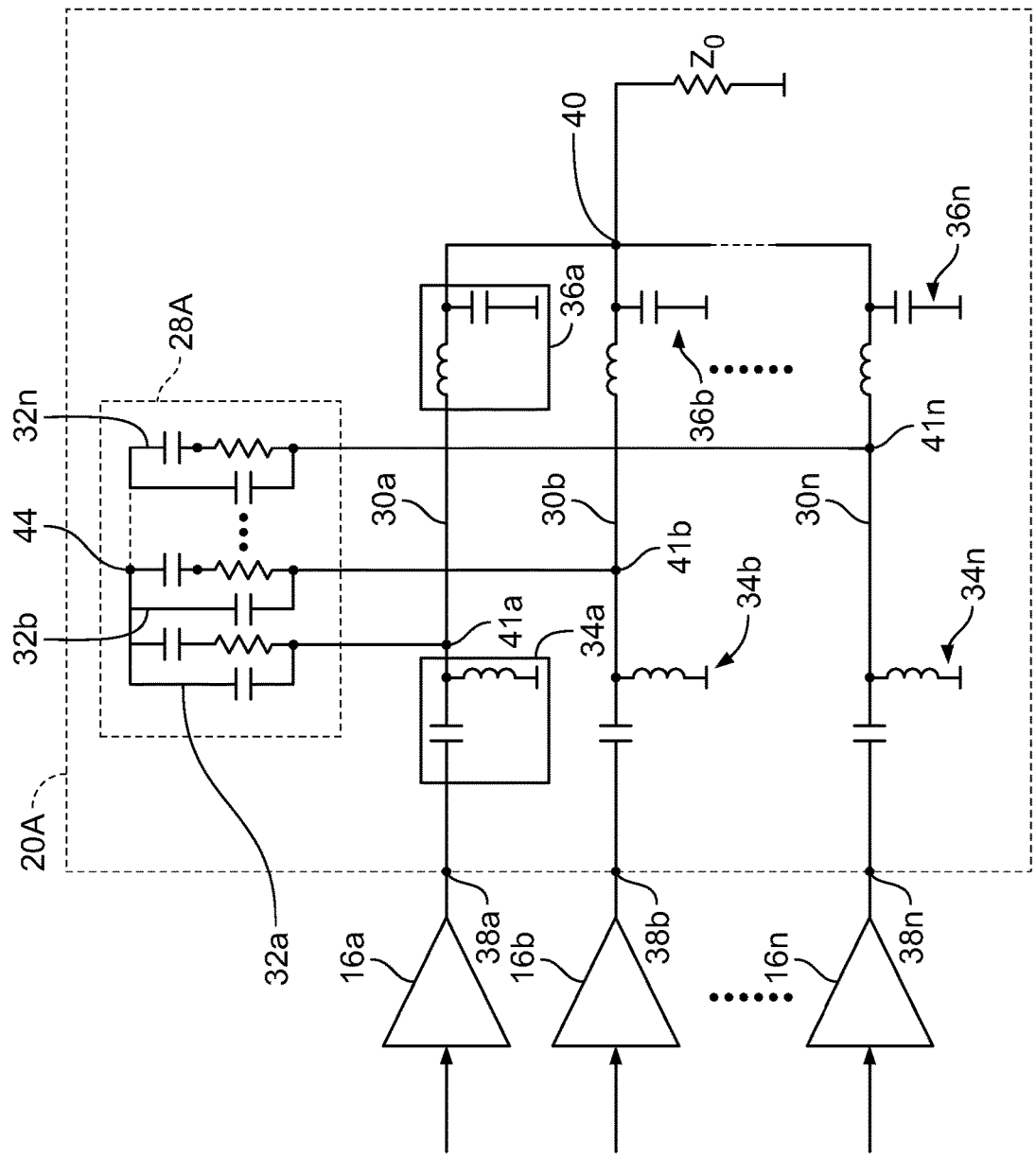
FIG. 2 is a circuit diagram of a power combiner, in accordance with various embodiments.
Figure 3:
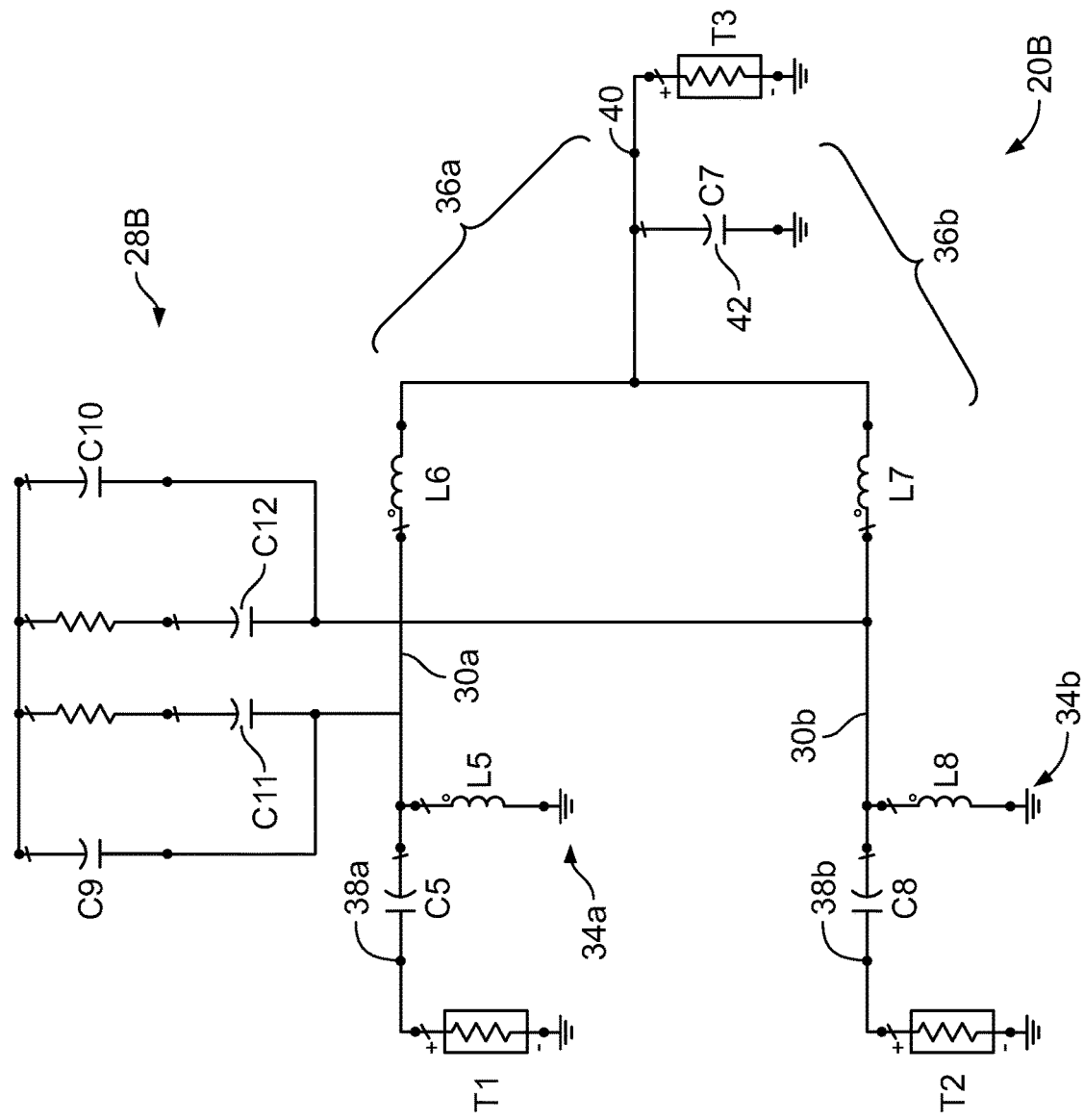
FIG. 3 is a circuit diagram of another power combiner, in accordance with various embodiments.
Figure 4:
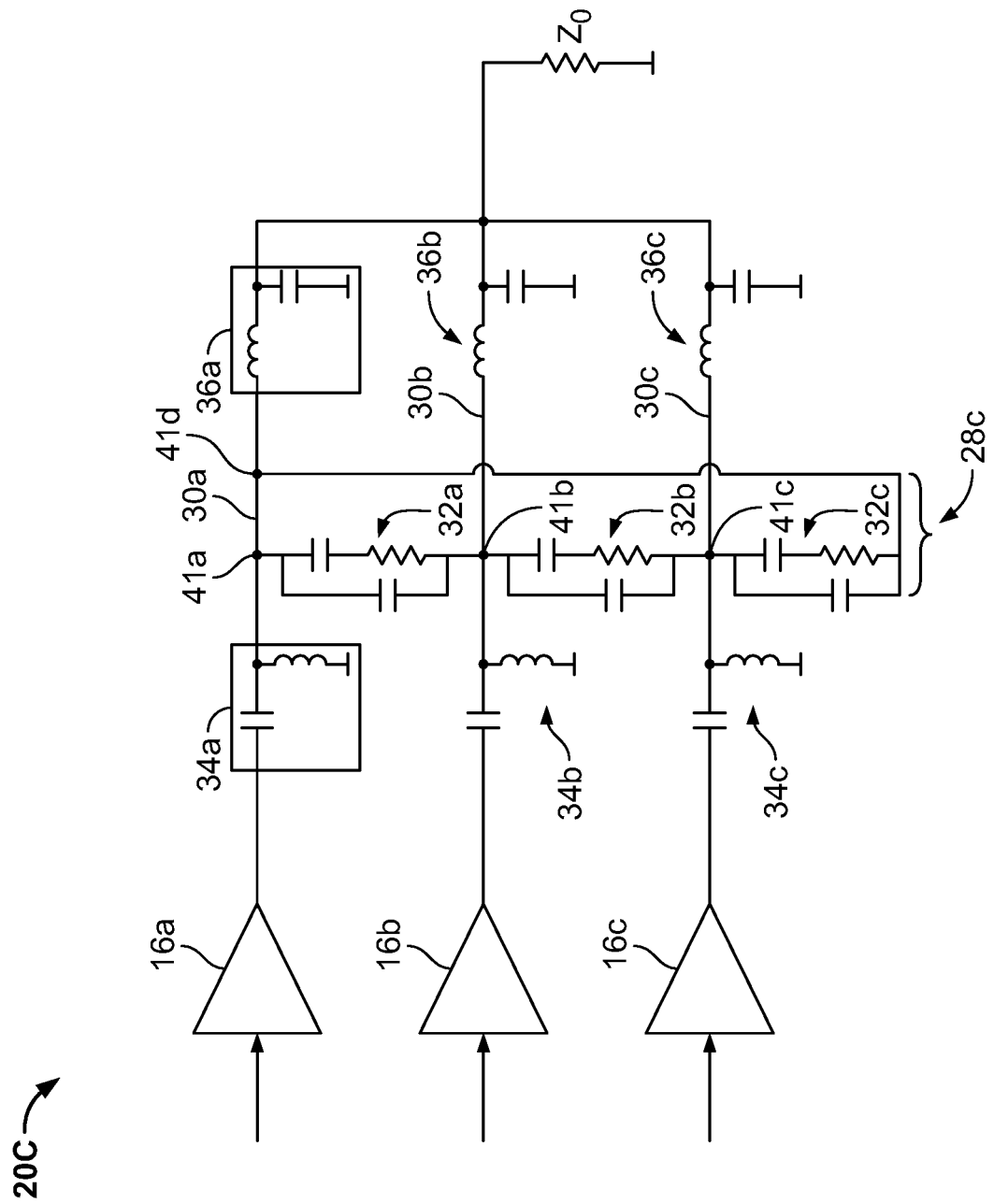
FIG. 4 is a circuit diagram of another power combiner, in accordance with various embodiments.

FIG. 2 is a circuit diagram of a first power combiner 20A, in accordance with various embodiments. The power combiners disclosed herein with respect to FIGS. 2 to 4 are useful as the power combiner 20 in the generator 10 of FIG. 1. The power combiner 20A includes a plurality of impedance matching circuit branches 30a to 30n each having an input 38a to 38n connected to receive a power signal output from one of the power amplifiers 16a to 16n. There are n impedance matching circuit branches 30a to 30n, one for each power amplifier 16a to 16n. As such, the impedance matching circuit branches 30a to 30n receive power signals output from the power amplifiers 16a to 16n in parallel.

In various embodiments, each impedance matching circuit branch 30a to 30n includes a high pass filter 34a to 34n (or high pass filter section) and a low pass filter 36a to 36n (or low pass filter section). In FIG. 2, the high pass filter 34a to 34n is located closer to the input 38a to 38n than the low pass filter 36a to 36n. In other embodiments, the low pass filter 36a to 36n is located closer to the input 38a to 38n than the high pass filter 34a to 34n. In the exemplary embodiment of FIG. 2, one set of high and low pass filters 34a to 34n, 36a to 36n are provided in each impedance matching circuit branch 30a to 30n. It is envisaged that a plurality, m, of such sets are included in each impedance matching circuit branch 30a to 30n. The larger m, the greater number of circuit components and the greater potential losses but also further bandwidth increases are possible.

In the exemplary embodiment of FIG. 2, each high pass filter 34a to 34n comprises at least one capacitor and at least one inductor. In the exemplary embodiment, there are one capacitor and one inductor and the inductor is connected to ground. Each low pass filter 36a to 36n includes at least one capacitor and at least one inductor. In the exemplary embodiment, there are one inductor and one capacitor and the capacitor is connected to ground. The high pass filters 34a to 34n and the low pass filters 36a to 36n are shown connected one after the other in the exemplary circuit diagram of FIG. 2. However, Pi and T type connections, amongst others, are also possible. The high pass filters 34a to 34n can be described as CL networks and the low pass filters can be described as LC networks. A variety of other high pass filter configurations are possible. Similarly, a variety of other low pass filter configurations are possible. A variety of capacitor and inductor components are available such as lumped components.

It is further possible to construct inductive and capacitive elements using transmission line elements as series transmission lines, open and shorted stubs in order to provide the high pass filters 34a to 34n and the low pass filters 36a to 36n. Such substitution is applicable for the lumped capacitive and/or inductive components shown in any of the circuit diagrams of FIGS. 2 to 5 herein. FIG. 7 discloses one exemplary embodiment of how lumped capacitive and inductive elements can be substituted by transmission lines with design characteristic impedance and electrical length.

Figure 7A:
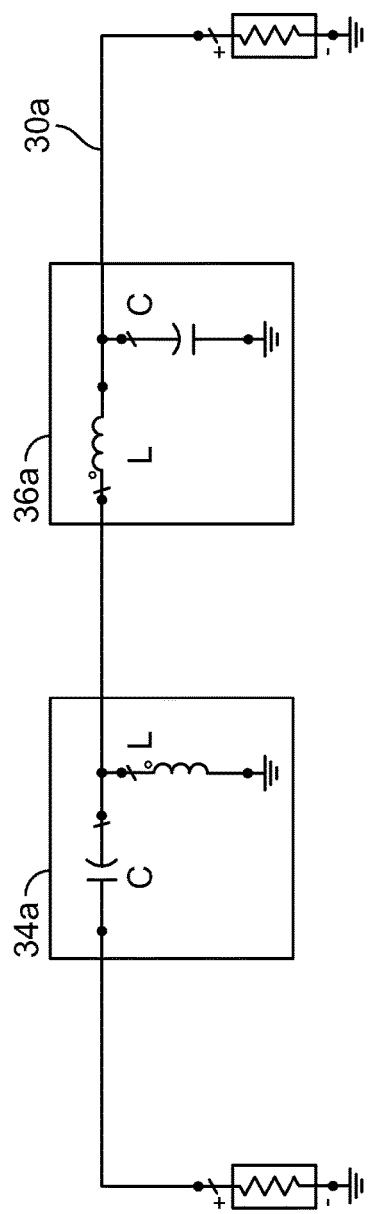
FIGS. 7a, 7b, and 7c show substitution of lumped circuit elements with transmission lines, in accordance with various embodiments.
Figure 7B:
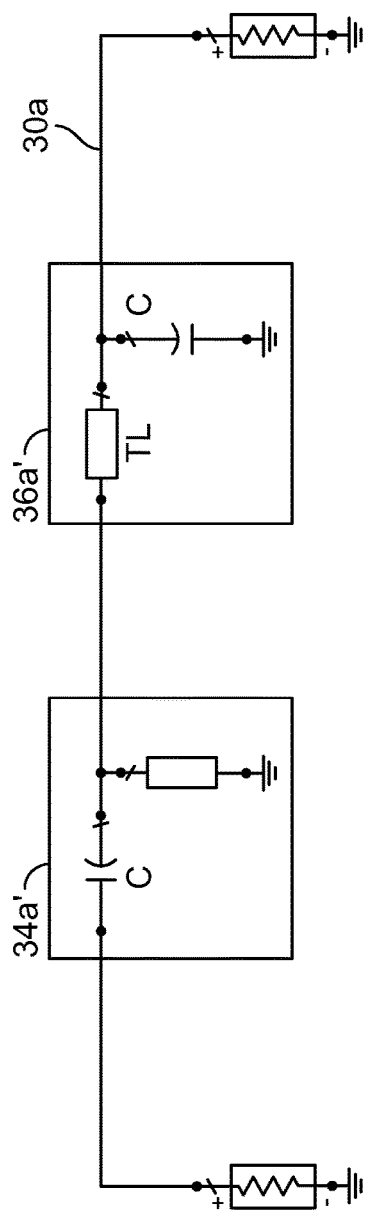
Figure 7C:
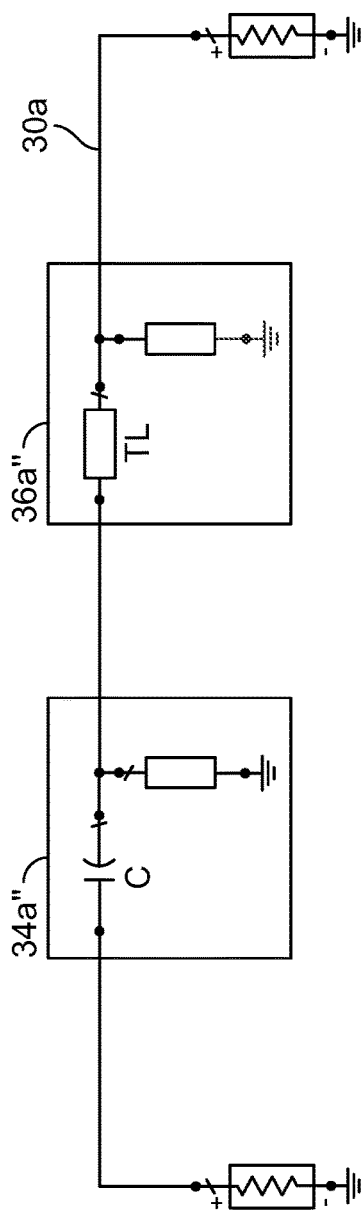

FIG. 7(a) illustrates impedance matching circuit branch 30a having a high pass filter 34 and a low pass filter including lumped components according to FIG. 2. In the exemplary embodiment of FIG. 7(b), high pass filter 34 is substituted by high pass filter 34a' having a lumped capacitor and a shorted stub transmission line providing an inductor. Further, low pass filter 36 is substituted by low pass filter 36a' having a transmission line to provide the inductor and a shunted, lumped capacitor. In another variation shown in FIG. 7(c), the low pass filter 36a" includes an open stub transmission line for providing a capacitor and a transmission line for providing an inductor. The transmission lines in FIGS. 7(b) and 7(c) have characteristic impedance and electrical length to provide a desired capacitance or inductance equivalent to the lumped components shown in FIG. 7(a). Each impedance matching circuit branch 30a to 30n can have one or more of the lumped capacitors or inductors substituted by a corresponding transmission line implementation as shown in FIGS. 7(b) and 7(c).

The capacitance and inductance values for the high pass filters 34a to 34n and the low pass filters 36a to 36n can be derived, for example, using Smith-Chart input parameters to achieve the desired impedance matching. In one specific example, the input parameters include load impedance of the common load (e.g. 50 Ohm, mostly equal to $Z_0$), $Z_0$ for the amplifiers (mostly equal to $Z_0$ 50 Ohm), number of amplifiers n, impedance transformation can be calculated (e.g. 50 Ohm to 100 Ohm), frequency (e.g. 13.56 MHz), number of sections (high pass, low pass), e.g. m=2 (one low pass filter and one high pass filter), network topology CLLC or LCCL or using transmission (microstrip) lines.

In embodiments, the first impedance matching circuit 20A comprises a first balancing circuit 28A for providing isolation between the inputs 38a to 38n of the first impedance matching circuit 20A. The first balancing circuit 20A includes a plurality of balancing circuit branches 32a to 32n. Balancing circuit branches 32a to 32n are connected to the impedance matching circuit branches 30a to 30n at tapping points 41a to 41n. In various embodiments, there are n tapping points 41a to 41n, one for each impedance matching circuit branch 30a to 30n. In the disclosed exemplary embodiment, there are n balancing circuit branches 32a to 32n, one for each impedance matching circuit branch 30a to 30n. In embodiments, each balancing circuit branch 32a to 32n is connected to each other. In the exemplary embodiment of FIG. 2, the balancing circuit 28A includes a common balancing point 44 at which all balancing circuit branches 32a to 32n are connected together. Such a manner of connecting different phase branches can be described as a Y or star connection. The balancing circuit 28A is designed such that a parasitic differential mode between the inputs of the power combiner 26A is matched by providing the tapping points 41a to 41n between the high pass filters 34a to 34n and the low pass filters 36a to 36n.

In various embodiments, each balancing circuit branch 32a to 32n includes at least one resistor and at least one capacitor connected in series. In the exemplary embodiment of FIG. 2, a further capacitor is connected in parallel to the series connected capacitor and resistor. Various other configurations are possible for the impedance matching circuit branches 32a to 32n. For example, the second capacitor connected in parallel is not necessarily included as described below with respect to FIG. 5. The capacitors and resistors could be of known kinds (such as lumped components). However, other forms of providing resistive and capacitive elements to form the isolating, balancing circuit branches 32a to 32n, including corresponding transmission lines (microstrip technology) as described with respect to FIGS. 7(a) to 7(c).

FIG. 3 is a circuit diagram of a second power combiner 20B including a second type of impedance matching branches and a second balancing circuit 28B, in accordance with a further exemplary embodiment. The second power combiner 20B is the same, in many respects, to the first power combiner 20A of FIG. 2 except that a specific configuration of n (number of power amplifiers 16a, 16b and corresponding number of impedance matching circuit branches 30a, 30b) is 2. Further, in the exemplary embodiment of FIG. 3, the electrical component 42 of the high or low pass filter closest to the output 40 of the second impedance matching circuit 20B is a shared component between each impedance matching circuit branch 30a, 30b. The shared electrical component 42 is a capacitor C7 in the present configuration, although it could be a shared inductor if the high pass filters 34a, 34b and the low pass filters 36a, 36b were arranged in a different order.

Exemplary values for the various resistances, capacitances and inductances of the circuit components of FIG. 3 are provided in the following table, by way of illustration only, for a combined output power having a frequency of 13.56 MHz and a characteristic impedance $Z_0$ of 50 Ohm at parallel power signal input terminals T1, T2 and at combined power signal output terminal T3. These values can be determined using available circuit design software tools using the circuit structure shown, the characteristic impedance, the desired center frequency and a desired bandwidth (>±5%) as inputs.

| Capacitor ID | Capacitance (pF) | Resistor ID | Resistance (Ohm) | Inductor ID | Inductance (nH) |
|---|---|---|---|---|---|
| C5 | 355 | R1 | 50 | L5 | 1293 |
| C7 | 147 | R2 | 50 | L6 | 535 |
| C8 | 355 | | | L7 | 535 |
| C9 | 148 | | | L8 | 1293 |
| C10 | 148 | | | | |
| C11 | 355 | | | | |
| C12 | 355 | | | | |

FIG. 4 is a circuit diagram of a third power combiner 20C including a third balancing circuit 28C, in accordance with a yet further exemplary embodiment. The third power combiner 20C is the same, in many respects, to the first power combiner 20A of FIG. 2 except that a specific configuration of n (number of power amplifiers 16a, 16b, 16c and corresponding number of impedance matching circuit branches 30a, 30b, 30c) is 3. The third balancing circuit 28C further differs from the first balancing circuit 28A by being provided in a delta configuration. That is, a first balancing circuit branch 32a is connected between the first and second impedance matching circuit branches 30a, 30b via respective tapping points 41a, 41b. A second balancing circuit branch 32b is connected between the second and third impedance matching circuit branches 30b, 30c via respective tapping points 41b, 41c. A third balancing circuit branch 32c is connected between the first and third impedance matching circuit branches 30a, 30c via respective tapping points 41c, 41d. Thus, each different pair of impedance matching circuit branches 30a, 30b, 30c has a balancing circuit branch 32a, 32b, 32c connected therebetween via respective tapping points 41a, 41b, 41c, 41d. The balancing circuit branches 32a, 32b, 32c are constituted with capacitors and a resistor as hereinbefore described with respect to the first balancing circuit 28A.

An n=3 power combiner as shown in FIG. 4 is operable with a star type balancing circuit 28A as shown in FIG. 2. Similarly, the delta configuration type balancing circuit 28C of FIG. 4 is operable with n>3 power combiners.

Figure 5:
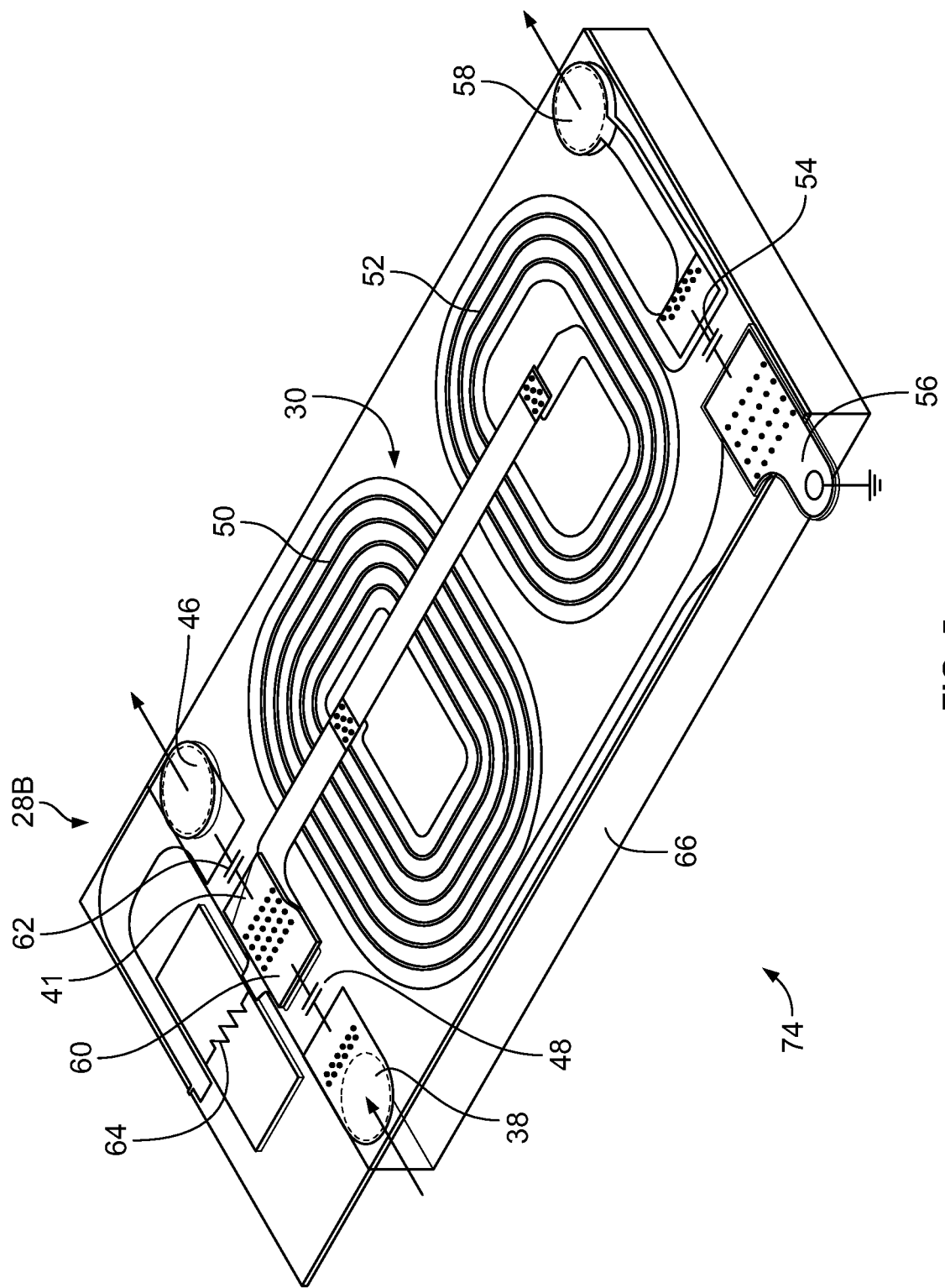
FIG. 5 is an impedance matching circuit branch included on a printed circuit board, in accordance with various embodiments.

FIG. 5 is a printed circuit board 74 including a third type of impedance matching circuit branches, in accordance with another exemplary embodiment. The impedance matching branch 30 is similar to the impedance matching branches of FIGS. 2 and 3. Indeed, the topology of FIG. 5 is adapted for constructing the impedance matching circuit branches 30a, 30b of FIGS. 2 and 3. In FIG. 5, the impedance matching circuit branch 30 includes, in order, an input terminal 38 corresponding to one of the aforementioned inputs 38a to 38n, a first capacitor 48, a first inductor 50, a second inductor 52, a second capacitor 54 and an output terminal 58, which corresponds to the aforementioned output 40. The first capacitor 48 and the first inductor 50 provide one of the aforementioned high pass filters 34a to 34n. The second inductor 52 and the second capacitor 54 correspond to one of the aforementioned low pass filters 36a to 36n.

In various embodiments, the first inductor 50 and the second inductor 52 are provided as planar inductors. In some examples, the first capacitor 48 and the second capacitor 54 are provided as lumped capacitors. In embodiments, the first capacitor 48 and the second capacitor 54 are ceramic multi-layer capacitors. In embodiments, the first inductor 50 has a greater inductance (e.g. a greater number of turns) than the second inductor 52 such that the high pass filter 34 has a greater inductance than the low pass filter 36. In embodiments, the first capacitor 48 has a greater capacitance than the second capacitor 54 such that the low pass filter 36 has a lower capacitance than the high pass filter 34.

The printed circuit board 74 includes, in some embodiments, a second balancing circuit 28B. The second balancing circuit 28B is similar to the afore-described first balancing circuit 28A (and could be substituted therewith, in some embodiments) except that an additional capacitor connected in parallel is not provided. The second balancing circuit 28B includes a third capacitor 62 and a first resistor 64 connected in series. The second balancing circuit 28B is connected to the impedance matching circuit branch 30 at a tapping point 41. The tapping point 41 is located at the connection between the first capacitor and the first inductor 50, which, electrically, locates the tapping point 41 between the high pass filter 34 and the low pass filter 36. The second balancing circuit 28B includes a common balancing terminal 46 connected in series with the third capacitor 62 and the first resistor 64.

The printed circuit board 74 includes a ground terminal 56 to which the first inductor 50 and the second capacitor 54 are connected. The input terminal 38, the output terminal 58, the ground terminal 56 and the common balancing terminal 46 are provided as pins, plates and other forms, in various embodiments.

In the exemplary embodiment of FIG. 5, the printed circuit board 74 includes a dielectric substrate 66 upon which the impedance matching circuit branch 30 is disposed. In some embodiments, the dielectric substrate 66 is disposed on a ground/heat sink (not shown) and is configured to transfer dissipated energy to the heat sink.

In exemplary embodiments, the input terminal 38 is connectable to a power amplifier 16a and the output terminal 58 is connected to an output port of a generator 10. In order to combine parallel power signals from a plurality of n power amplifiers 16a to 16n, a power combiner is constructed including n impedance matching circuit branches 30a to 30n according to the construction shown in FIG. 5. The impedance matching circuit branches 30a to 30n are disposed on a common dielectric substrate 66, in some embodiments, and on respective dielectric substrates 66, in other embodiments. The impedance matching circuit branches 30a to 30n are located next to each other along a plane of the dielectric substrate 66, in some embodiments, and stacked relative to one another, in other embodiments. The power amplifiers 16a to 16n are connected to respective input terminals 38a and the common balancing terminals 46 are each connected to another common balancing terminal 46 so as to provide the common balancing point 44. The output terminals 58 are connected to each other and to a common output to thereby provide the combined output power signal at the output connector 40. It is acknowledged by the person skilled in the art that the disclosed printed circuit board may comprise each of the aforementioned circuits.

Figure 6A:
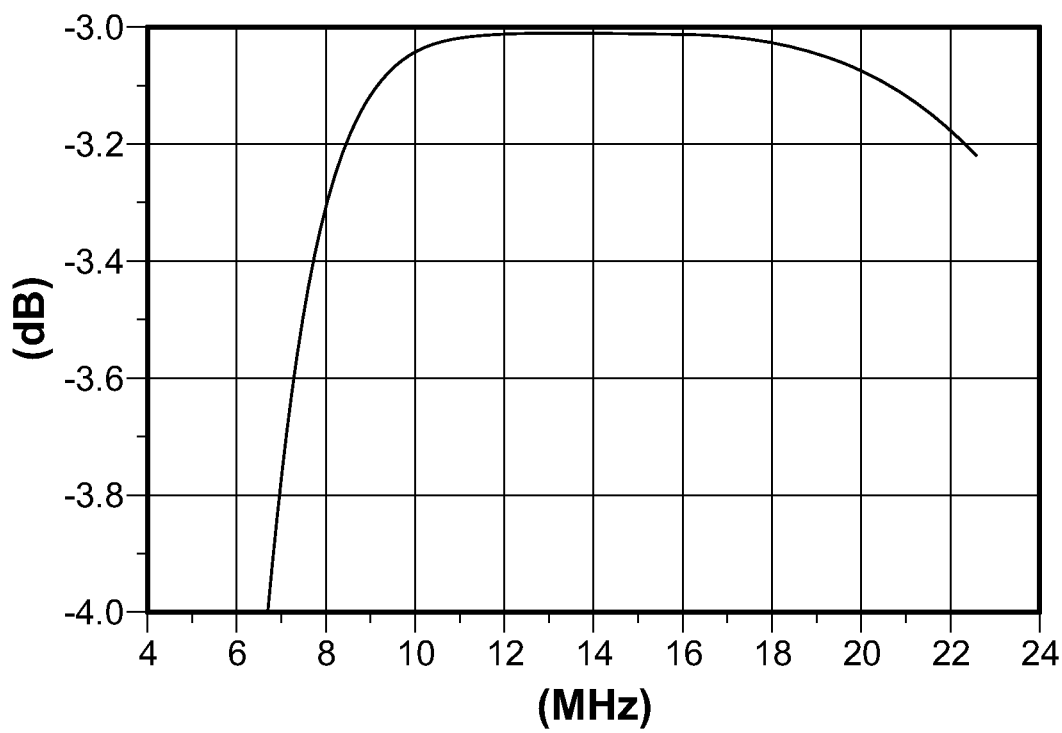
FIGS. 6a and 6b are a graph illustrating bandwidth of the reflection coefficient at one input of a power combiner, in accordance with one exemplary embodiment.
Figure 6B:
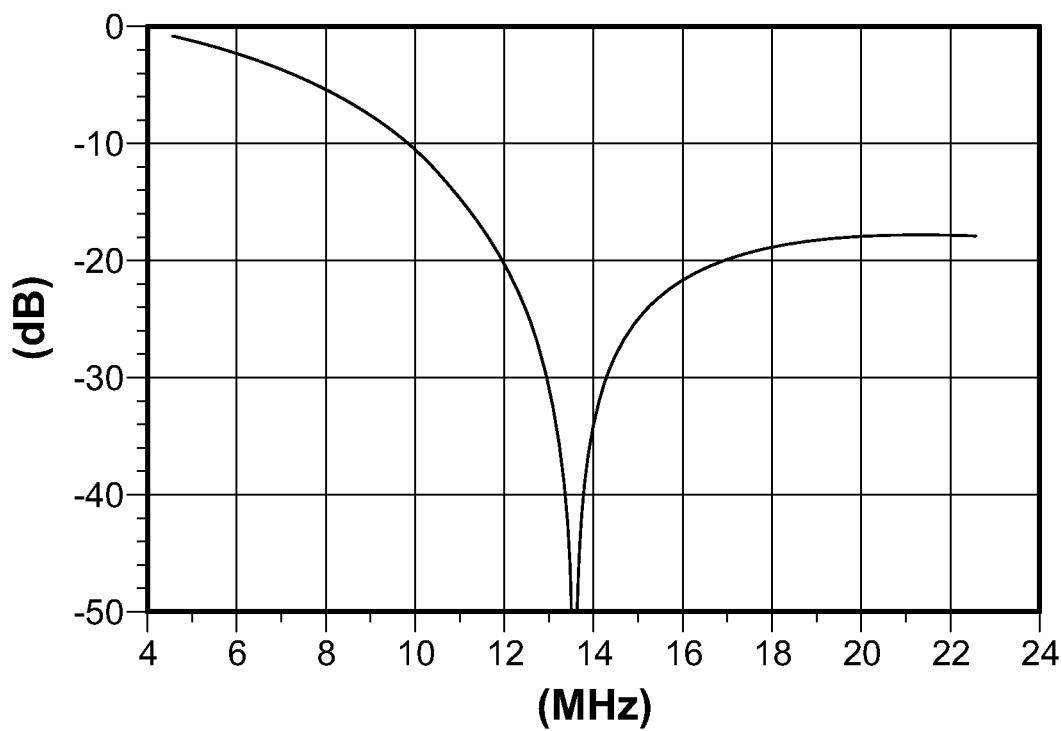

FIG. 6(a) is a graph illustrating input to output transmission of the power combiner of FIG. 3 and FIG. 6(b) illustrates reflection coefficient at one of the inputs 38a, 38b of the power combiner of FIG. 3. The graphs of FIGS. 6(a) and 6(b) were generated based on an S-Parameter of the power combiner of ~13.56 MHz. In the illustrated embodiment, a bandwidth of +−5% of the power combiner 20B is achieved, where the bandwidth is defined as having a reflection coefficient of <−30 dB and a transmission variation <0.05 dB. While at least one exemplary aspect has been presented in the foregoing detailed description of the invention, it should be appreciated that a vast number of variations exist. It should also be appreciated that the exemplary aspect or exemplary aspects are only examples, and are not intended to limit the scope, applicability, or configuration of the invention in any way. Rather, the foregoing detailed description will provide those skilled in the art with a convenient road map for implementing an exemplary aspect of the invention. It being understood that various changes may be made in the function and arrangement of elements described in an exemplary aspect without departing from the scope of the invention as set forth in the appended claims.

The invention claimed is:

1. A power combiner, comprising:
a plurality of inputs, each input connectable to a respective power amplifier for receiving a respective power signal;
a plurality of impedance matching circuit branches connected to a respective one of the plurality of inputs;
each impedance matching circuit branch including at least one high pass filter section and at least one low pass filter section through which the respective power signal passes,
the impedance matching circuit branches connected so as to combine the power signals from each power amplifier;
an output for outputting the combined power signal; and
a balancing circuit connecting each of the impedance matching circuit branches and isolating the inputs from each other, wherein
the balancing circuit comprises a plurality of balancing circuit branches connected to each of the impedance matching circuit branches at tapping points, and
the tapping points are each located between the at least one high pass filter section and the at least one low pass filter section of the respective impedance matching circuit branch.

2. The power combiner according to claim 1, wherein the at least one high pass filter section and the at least one low pass filter section each comprises a passive filter.

3. The power combiner according to claim 1, wherein the at least one high pass filter section comprises at least one inductor and at least one capacitor.

4. The power combiner according to claim 3, wherein the at least one inductor of the at least one high pass filter section is shunted to ground.

5. The power combiner according to claim 1, wherein the at least one low pass filter comprises at least one inductor and at least one capacitor.

6. The power combiner according to claim 5, wherein the at least one capacitor of the at least one low pass filter is shunted to ground.

7. The power combiner according to claim 1, wherein each of the balancing circuit branches is interconnected at a common balancing point.

8. The power combiner according to claim 1, wherein the at least one high pass filter section and the at least one low pass filter section each comprises at least one planar inductor and at least one capacitor.

9. The power combiner according to claim 1, wherein each balancing circuit branch comprises at least one resistor and at least one capacitor.

10. The power combiner according to claim 1, wherein each balancing circuit branch comprises a resistor and a first capacitor connected in series and a second capacitor connected in parallel to the series connected resistor and the first capacitor.

11. The power combiner according to claim 1, wherein the at least one high pass filter section or the at least one low pass filter section comprises at least one transmission line and at least one capacitor.

12. A generator, comprising:
a plurality of amplifiers; and
a power combiner, the power combiner comprising:
a plurality of inputs, each input connectable to a respective power amplifier of the plurality of amplifiers for receiving a respective power signal therefrom;
a plurality of impedance matching circuit branches connected to a respective one of the plurality of inputs;
each impedance matching circuit branch including at least one high pass filter section and at least one low pass filter section through which the respective power signal passes;
the impedance matching circuit branches connected at an output so as to combine the power signals from each power amplifier;
the output for outputting the combined power signal; and
a balancing circuit connecting each of the impedance matching circuit branches and isolating the inputs from each other,
wherein the balancing circuit comprises:
a plurality of balancing circuit branches connected to each of the impedance matching circuit branches at tapping points, wherein the tapping points are each located between the at least one high pass filter section and the at least one low pass filter section of the respective impedance matching circuit branch.

13. The generator according to claim 12, wherein the at least one high pass filter section comprises at least one inductor and at least one capacitor and the at least one low pass filter comprises at least one inductor and at least one capacitor.

14. The generator according to claim 12, wherein each balancing circuit branch comprises a resistor and a capacitor.

15. The generator according to claim 12, wherein the at least one high pass filter section comprises at least one inductor and at least one capacitor, wherein the at least one inductor of the at least one high pass filter section is shunted to ground and wherein the at least one low pass filter comprises at least one inductor and at least one capacitor, and wherein the at least one capacitor of the at least one low pass filter is shunted to ground.

16. The generator according to claim 15, wherein the at least one inductor of the at least one high pass filter section and/or the at least one inductor of the at least one low pass filter section is provided by a transmission line or by a lumped component.

17. A generator in combination with a plasma tool including a plasma chamber, wherein the generator comprises:
a plurality of amplifiers; and
a power combiner, the power combiner comprising:
a plurality of inputs, each input connectable to a respective power amplifier of the plurality of amplifiers for receiving a respective power signal therefrom;
a plurality of impedance matching circuit branches connected to a respective one of the plurality of inputs;
each impedance matching circuit branch including at least one high pass filter section and at least one low pass filter section through which the respective power signal passes;
the impedance matching circuit branches connected so as to combine the power signals from each power amplifier; and
an output for outputting the combined power signal.

18. A printed circuit board comprising:
a dielectric substrate;
a plurality of input terminals arranged on the dielectric substrate;
a plurality of impedance matching circuit branches arranged on the dielectric substrate, wherein each of the impedance matching circuit branches comprises at least one high pass filter section and at least one low pass filter section, each configured to filter an input power signal received by one of the input terminals;
an output terminal arranged on the dielectric substrate, wherein the output terminal is configured to output the combined filtered power signal; and
a balancing circuit connecting each of the impedance matching circuit branches and isolating the input terminals from each other, wherein
the balancing circuit comprises a plurality of balancing circuit branches connected to each of the impedance matching circuit branches at tapping points, and wherein
the tapping points are each located between the at least one high pass filter section and the at least one low pass filter section of the respective impedance matching circuit branch.

* * * * *